United States Patent
Jeserer et al.

(10) Patent No.: US 8,303,008 B2
(45) Date of Patent: *Nov. 6, 2012

(54) PLUNGER FOR HOLDING AND MOVING ELECTRICAL COMPONENTS

(75) Inventors: Gunther Jeserer, Tuntenhausen (DE); Efe Varol, Rosenheim (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 152 days.

This patent is subject to a terminal disclaimer.

(21) Appl. No.: 12/671,118

(22) PCT Filed: Oct. 2, 2008

(86) PCT No.: PCT/EP2008/008390
§ 371 (c)(1),
(2), (4) Date: Jan. 28, 2010

(87) PCT Pub. No.: WO2009/046946
PCT Pub. Date: Apr. 16, 2009

(65) Prior Publication Data
US 2010/0196125 A1    Aug. 5, 2010

(30) Foreign Application Priority Data
Oct. 5, 2007   (DE) .......................... 10 2007 047 679

(51) Int. Cl.
*B25J 15/06* (2006.01)
(52) U.S. Cl. ..................................................... 294/185
(58) Field of Classification Search ................. 294/64.1, 294/64.2, 64.3, 65, 185, 188; 414/627, 737, 414/752.1; 901/40, 46; 324/760
See application file for complete search history.

(56) References Cited

U.S. PATENT DOCUMENTS

| | | | |
|---|---|---|---|
| 5,147,821 A | 9/1992 | McShane et al. | |
| 5,847,366 A | 12/1998 | Grunfeld | |
| 5,977,785 A | 11/1999 | Burward-Hoy | |
| 6,019,166 A | 2/2000 | Viswanath et al. | |
| 6,069,483 A | 5/2000 | Maxwell et al. | |
| 6,119,460 A * | 9/2000 | Huang ............................. 62/3.3 |
| 6,549,026 B1 * | 4/2003 | DiBattista et al. ........ 324/750.09 |
| 6,891,385 B2 * | 5/2005 | Miller ....................... 324/750.08 |
| 6,978,541 B1 * | 12/2005 | Feltner et al. .................... 29/840 |
| 7,480,985 B2 * | 1/2009 | Yan ................................. 29/740 |

(Continued)

FOREIGN PATENT DOCUMENTS

JP          6297371 A       10/1994

(Continued)

OTHER PUBLICATIONS

International Search Report for PCT/EP2008/008390, mailed Mar. 26, 2009.

(Continued)

*Primary Examiner* — Dean Kramer
*Assistant Examiner* — Stephen Vu
(74) *Attorney, Agent, or Firm* — Nixon & Vanderhye P.C.

(57) ABSTRACT

A plunger for holding and moving electronic components in particular for introduction and removal of IC's to and from a contacting device connected to a test bed comprises a plunger head with at least one suction head for sectional contact with a component. A heat-conducting body, temperature-controlled by means of a fluid, is arranged such that the suction-contacted component is in contact with the heat-conducting body. The suction head passes through the heat-conducting body.

17 Claims, 4 Drawing Sheets

U.S. PATENT DOCUMENTS

2006/0261833 A1  11/2006  Boyle et al.

FOREIGN PATENT DOCUMENTS

| JP | 7202095 A | 8/1995 |
| JP | 2000329821 A | 11/2003 |
| JP | 2006125864 A | 5/2006 |
| JP | 2007005685 A | 1/2007 |
| JP | 2007094034 A | 4/2007 |
| WO | WO 97/15837 | 1/1997 |

OTHER PUBLICATIONS

International Search Report for PCT/EP2008/008389, mailed Mar. 26, 2009.

* cited by examiner

PLUNGER FOR HOLDING AND MOVING ELECTRICAL COMPONENTS

CROSS-REFERENCE TO RELATED APPLICATIONS

This application is the U.S. national phase of International Application No. PCT/EP2008/008390 filed 2 Oct. 2008, which designated the U.S. and claims priority to German Application No. DE 10 2007 047 679.7 filed 5 Oct. 2007, the entire contents of each of which are hereby incorporated by reference.

FIELD

The invention relates to a plunger for holding and moving electronic components, in particular for moving ICs to and from a contacting device, which is connected to a test device, having a plunger head which comprises at least one suction head for sucking in a component and a heat conducting body according to the preamble of claim 1.

BACKGROUND AND SUMMARY

Electronic components such as ICs (semiconductor components with integrated circuits) are usually tested for their functionality before they are mounted on printed circuit boards, for example, or used otherwise. The components to be tested are contacted by an automatic handling machine, usually called a "handler", with contacting devices which in particular are in the form of contact bases, and are in electrical contact with a test head of a test device. After the end of the test process, the components are removed from the contacting devices by means of the handler, and sorted depending on the test result.

To hold and contact the components, handlers usually have plungers, i.e. longitudinally movable piston-like holding units, which can move back and forth and which can hold the components by means of a vacuum, in particular by applying a suction force. After the components have been placed, the plungers are brought within the handler into a position in which they can be moved forward on a straight path towards contacting devices, until the components come into contact with the contacting devices. After the test processes are carried out, the components are removed from the test head by means of the plunger, and positioned so that they can be removed from the handler via a discharge station and sorted depending on the test result.

To be able to carry out the tests under predetermined temperature conditions, it is also known to bring the components to predetermined temperatures before the test process. These temperatures can be, for example, in a range from −60° C. to +200° C.

The temperature of the components is usually controlled in a convective and/or conductive manner in a heat-insulated temperature control chamber, which can be arranged inside or outside the handler. In this case, multiple components are brought to the desired temperature simultaneously inside the temperature control chamber, before they are put onto the plungers and moved forward by them to the contacting devices. A disadvantage here is that in the time between the heating and the contacting of the components, or during the contacting of the components, heat losses occur, with the result that at the time of the test, the components are no longer at the precise setpoint temperature. The individual components which have been temperature controlled together in the temperature control chamber can also have different temperatures. The components may also lose electrical power during the electrical test.

From U.S. Pat. No. 5,977,785 A, a plunger according to the preamble of claim 1 is known. The plunger there has a head piece with a plurality of suction heads and a heat conducting body in the form of a contact plate which is arranged separately from the suction heads, and which can be heated or cooled by means of a hot or cold fluid. The sucked-in components rest against the contact plate and can be temperature controlled thereby. The temperature-controlled fluid is fed to the contact plate and taken away from it in closed circuits. However, a disadvantage is that the head piece is of complex construction and therefore must be relatively large, since the feed and take-off lines for the temperature-controlled fluid take up a relatively large amount of space and the contact plate must also be correspondingly large. For very small electronic components or for arrangements in which a plurality of plunger heads must be arranged closely next to one another, this known plunger head is unsuitable.

The invention is based on the object of creating a plunger of the above-mentioned kind, with which tests of electronic components can be carried out under predetermined temperature conditions as precisely as possible. The plunger should also be simply constructed and have a small overall size in the head region, so that it is suitable even for small components.

According to the invention, the suction head is fed through the heat conducting body. By way of the heat conducting body according to the invention, there is a very quick and intense transfer of heat from the heat conducting body to the component via heat conduction. Owing to its large surface area and the material it is made of, the temperature of the heat conducting body itself can be controlled extremely quickly using a fluid, which preferably consists of a gas, in particular clean air or nitrogen. The fluid can thus be conveyed from the interior of the handler or via fluid lines of the plunger to the heat conducting body. Depending on whether the components are to be tested at low temperature, ambient temperature or high temperature, the heat conducting body, and thus the component, is either cooled, kept at ambient temperature or heated. Because the temperature of the components is controlled directly at the plunger head, the temperature of the component which is held on the plunger can be controlled while it is being delivered to the assigned contacting device, and even during the test process, so that heat losses during the delivery movement and during the test process do not occur, or at least can be minimised. It is thus possible to control the temperature of the component in a very precise manner. The head piece can also be simply constructed and have a small overall size, so that the plunger can not only be used for large components, but also for very small ones.

According to an advantageous embodiment, the heat conducting body comprises a central axial through-opening, through which the suction head is guided. The contact surface between the heat conducting body and the component is thus kept extremely large so the temperature of the component can be controlled particularly effectively. A plurality of decentralised through-openings may also be provided in the heat conducting body, through each of which a suction head penetrates.

According to an advantageous embodiment, the plunger head comprises a retaining base which supports the sucked-in component and has an axial passage, in which the heat conducting body is arranged around the suction head or heads. In this embodiment the retaining body and heat conducting body are thus different parts, which simplifies production. Furthermore, it is therefore also possible for the heat conducting body and the retaining base to be made of different materials and to thus match these materials in an optimal manner to their respective applications. For example, the retaining base may be made of an electrically non-conductive material, in particular a plastics material, whilst the heat conducting body may be made of a particularly effective heat conducting metal. Alternatively however, it is also possible for the retaining base itself to be configured as a heat conducting body, i.e. for the retaining base to be configured in such a way that some regions of the retaining base, which contact the component, conduct heat particularly well in particular, a retaining base of this type may have fins or pins on its rear side which enlarge its surface and over which fluid flows.

According to an advantageous embodiment, the heat conducting body is held resiliently relative to the retaining base, in particular so as to be resiliently displaceable in the axial direction relative to the retaining base. Even if the size or shape of the components differs, it is thus ensured that they rest as flat as possible against the heat conducting body in order to ensure a good level of heat conduction.

It is particularly advantageous for the heat conducting body to be tiltably arranged relative to the longitudinal axis of the plunger. Even if the connecting legs (pins) of the component are not completely uniformly curved owing to tolerances, and the body of the component is tilted slightly out of its intended position or if the legs rest on supporting strips (lead backers) of the retaining base, complete surface contact of the body of the component against the heat conducting body is thus also ensured.

According to an advantageous embodiment, the heat conducting body consists of a disc-shaped body with fins projecting therebeyond, the disc-shaped body comprising a flat front face which can be contacted with the component, and the fins projecting rearwards beyond the disc-shaped body. The heat conducting body can thus be configured in a particularly compact manner, it also being possible to use extremely long fins which project rearwards into a fluid guide channel and which enable a particularly good transfer of heat from the fluid to the heat conducting body.

According to an advantageous embodiment, the retaining base comprises fluid guide recesses in its rear side, which open into the axial passage in the retaining base so at the rear side of the retaining base conveyed fluid can be guided towards the heat conducting body arranged in the axial passage in a targeted manner. It can thus be easily ensured that the greatest possible amount of fed, possibly temperature-controlled fluid flows directly over the heat conducting body, controlling the temperature of said body in a particularly effective manner.

According to an advantageous embodiment, the heat conducting body is displaceably guided by bolts extending in an axial direction and having a bolt head with a front face at their front end, which front face forms an axial stop for the component, and having a rear face which forms an axial stop for the heat conducting body. The heat conducting body is thus expediently pushed forward by springs which are arranged around the bolts. The heat conducting body is thus held resiliently and flexibly in the retaining base in a relatively simple and compact manner.

BRIEF DESCRIPTION OF THE DRAWINGS

The invention is explained in more detail below by way of example with reference to the drawings, in which.

DETAILED DESCRIPTION

Figure 1:
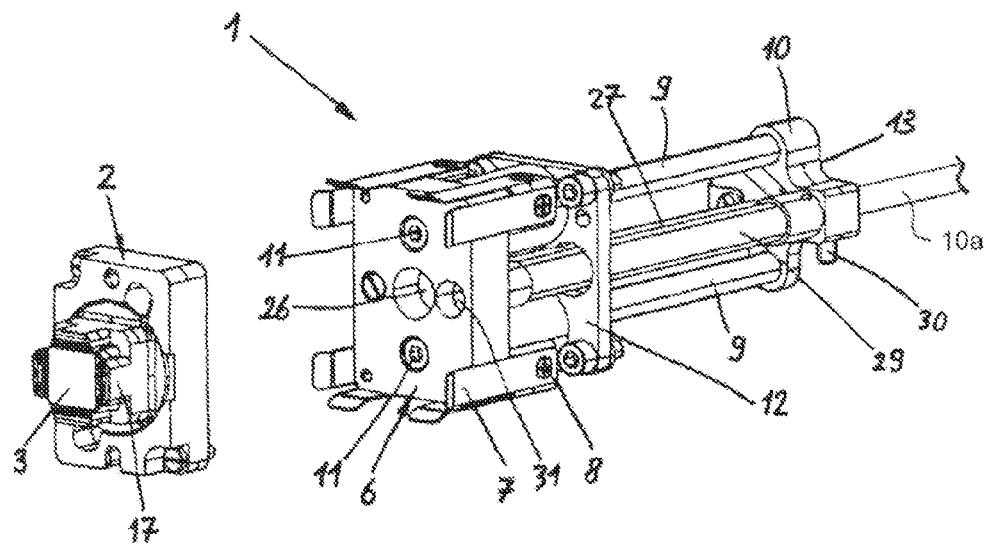
FIG. 1 is a perspective view of a plunger, a plunger head being shown separately from the other parts of the plunger.
Figure 4:
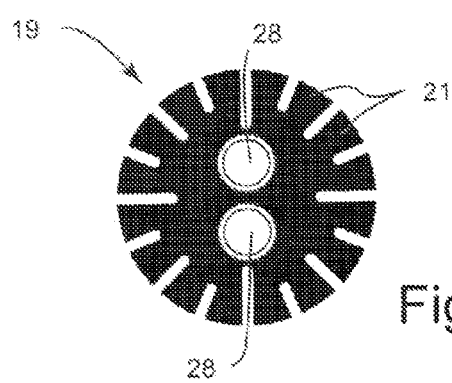
FIG. 4 is a plan view of an electronic component.

FIG. 1 is a partly exploded view of a plunger 1. The plunger 1 comprises a plunger head 2 which can hold an electronic component 3 at its front end by way of a suction force. In the embodiment shown, the component 3 is a component comprising integrated circuits, IC for short, which comprises a component body 4 and connecting legs 5 projecting laterally therefrom, as can be seen in FIG. 4. The plunger 1 may, however, also be used to hold and move other components, such as BGA or QFN components.

The plunger head 2 may be arranged on a cuboidal base body 6 and is held thereon in a lateral direction by spring tongues 7 which are fixed to the base body 6 via screws 8 and project forwards in an axial direction beyond the base body 6. The plunger head 2 can thus be slightly displaced together with the component 3 in the lateral direction when the plunger head 2 is retracted into a centring device (not shown) by pushing the plunger 1, which device is arranged in the vicinity of a contact base (not shown).

The base body 6 is connected to a rear end piece 10 via two guide rods 9 which are arranged parallel to the longitudinal axis of the plunger 1. Screws 11 can be seen in FIG. 1, with which the guide rods 9 are screwed at the front end thereof to the base body 6.

The plunger 1 is longitudinally movably held on a guiding device 12 via the two guide rods 9, which guiding device comprises guide sleeves (not shown in greater detail), in which the guide rods 9 are displaceably guided. The guiding device 12 can, for example, be fixed (in a way not shown in greater detail) to a rotating carriage or swivelling device, with which the plunger 1, together with the component 3 arranged thereupon, can be brought into a position in which the plunger 1 can be pushed forward in a straight line (to the left in FIG. 1) into a contact position, in which the connecting legs 5 of the component 3 (FIG. 4) are arranged on corresponding connecting contacts (not shown) of a contact base. The forward movement is effected by means of a feed device (not shown) which presses on a rear end face 13 of the rear end portion 10. The plunger 1 is moved back into its initial position by a restoring spring (not shown), the rear end of which is fixed to the plunger guiding device 12 and the front end of which is fixed to the base body 6.

Figure 2:
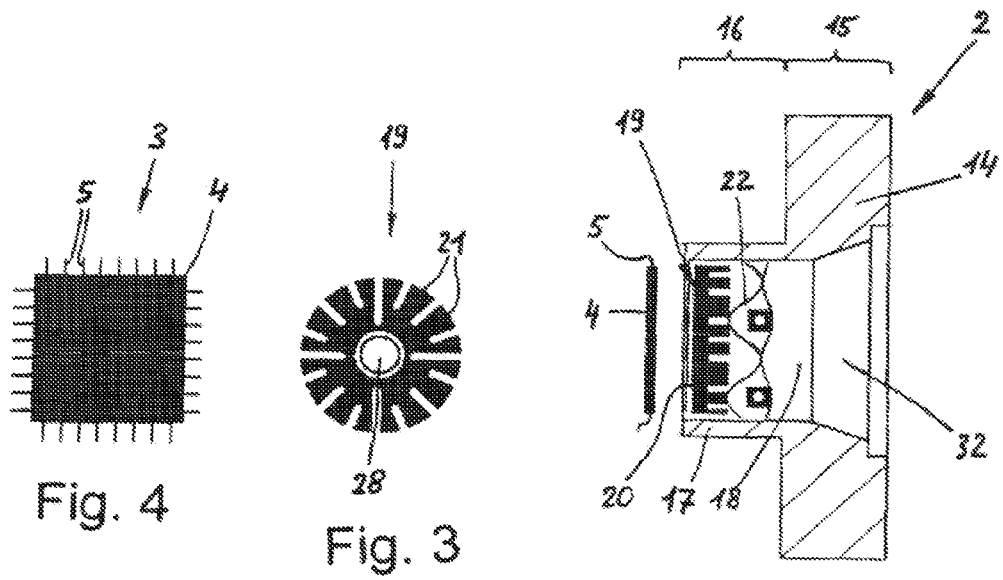
FIG. 2 is a longitudinal section through a plunger head together with a schematic view of the heat conducting body, albeit without the suction head.
Figure 3A:
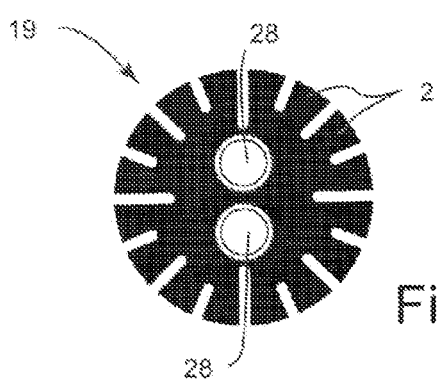
FIG. 3a is a plan view of an alternative heat conducting body.
Figure 5:
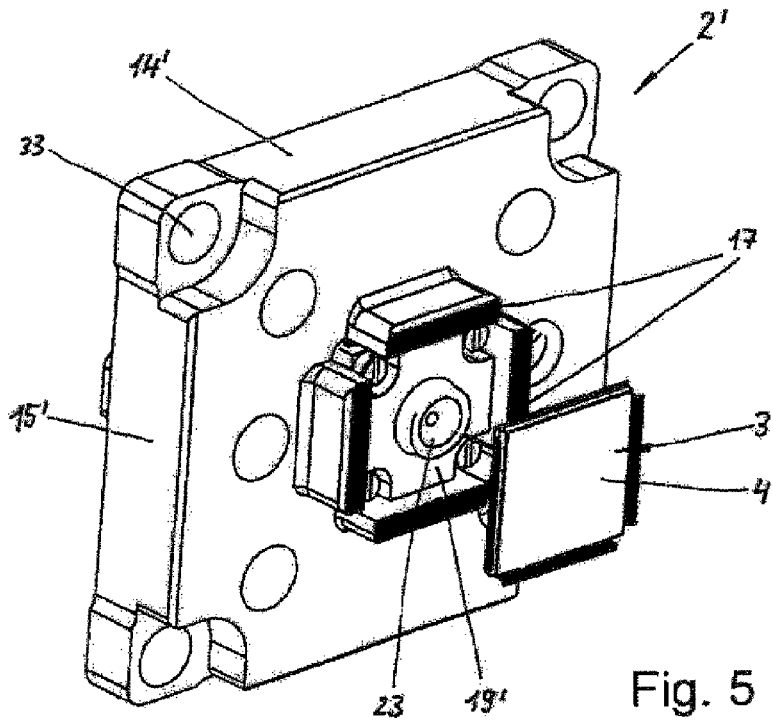
FIG. 5 is a perspective view of an alternative embodiment of a plunger head, tilting forwards.
Figure 6:
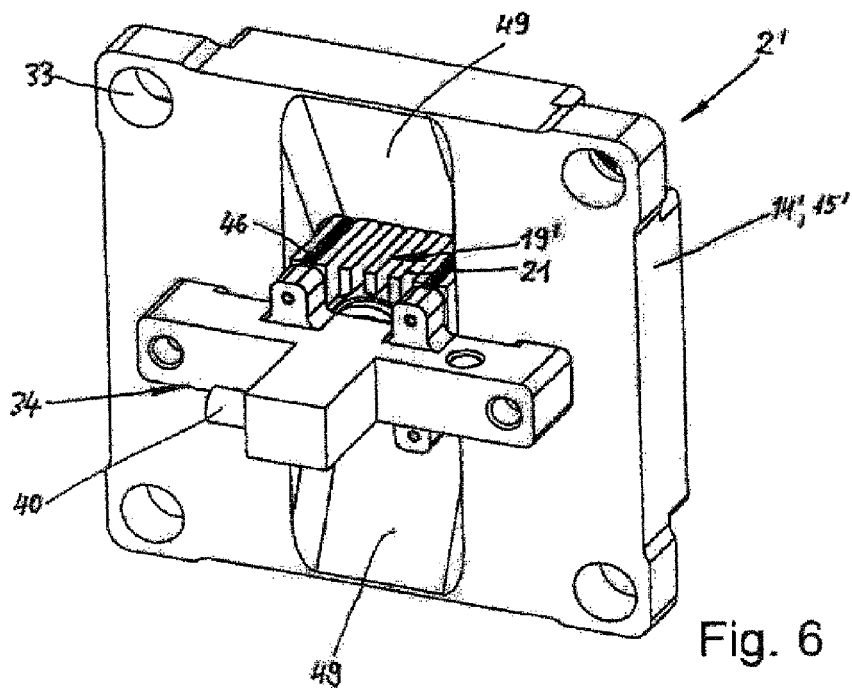
FIG. 6 is a perspective view of the plunger head from FIG. 5, tilting rearwards.

As can be seen in FIGS. 1 and 2, the plunger head 2 comprises a retaining base 14 which consists of a cuboidal base portion 15 and a front base portion 16 of reduced diameter which projects in an axial direction beyond the base portion 15. The front base portion 16 comprises four leg supporting webs 17 (lead backers) which, on four sides, delimit a central axial passage 18 in the retaining base 14. The connecting legs 5 of the components 3 rest on the front end faces of the leg supporting webs 17 when the components 3 are held on the plunger head 2.

As shown schematically in FIG. 2, a heat conducting body 19 is arranged in the central passage 18, the front end face 20 of which heat conducting body is arranged in the vicinity of the front end of the front base portion 16. The heat conducting body 19 consists of a disc-shaped body with a plurality of fins 21 which extend radially outwardly and rearwardly, i.e. against the direction in which the fluid flows. The heat conducting body 19 is also made of an effective heat conducting material. The front end face 20 of the heat conducting body 19 is flat and arranged in such a way that the body 4 of the component can completely contact the front end face 20 when the component 3 is arranged on the plunger head 2.

The outer diameter of the heat conducting body 19 is only slightly smaller than the diameter of the passage 18. If fluid having a specific temperature is introduced into the passage 18 from the rear, i.e. from the right-hand side in FIG. 2, only a very small amount of fluid can then flow past the heat conducting body 19 without contacting it and instead the fluid is forced to flow past through the gaps and slits between the fins 21, a large amount of fluid thus contacting the heat conducting body 19.

In order to ensure that the component 3 also lies flat against the heat conducting body 19 even if some of the connecting legs 5 of the component 3 are not optimally aligned, the heat conducting body 19 is resiliently supported in the passage 18 by a spring device 22, as shown schematically in FIG. 2. This spring device 22 is configured in such a way that the heat conducting body 19 may be slightly tilted inside the passage 18, i.e. can be brought into a diagonal position, so as to match a possible diagonal position of the body 4 of the component and thus maintain close contact with the body 4 of the component.

Figure 7:
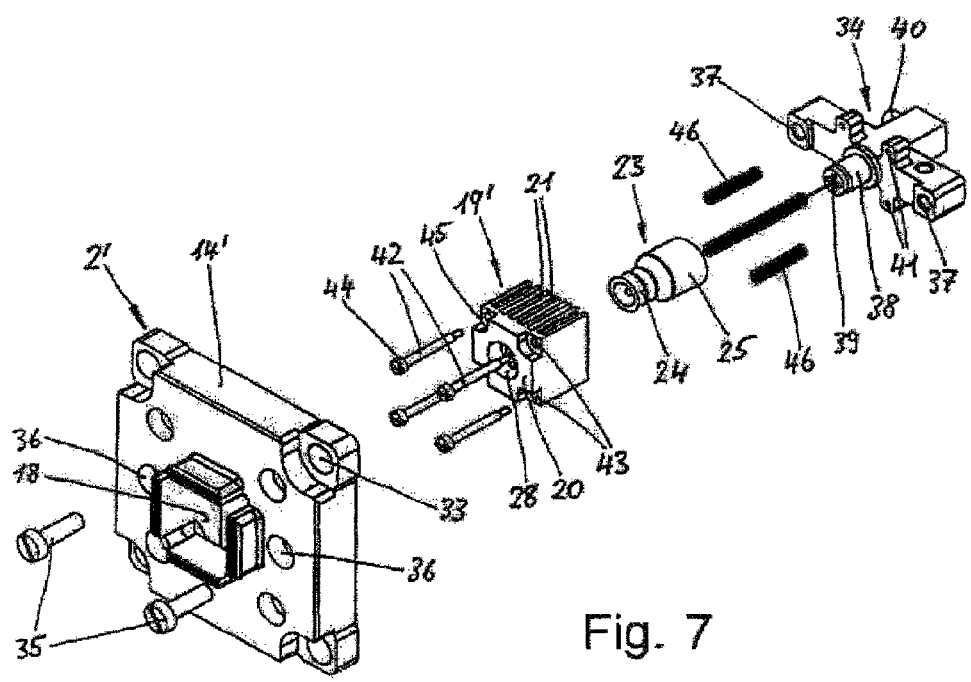
FIG. 7 is an exploded view of the plunger head from FIGS. 5 and 6.
Figure 8:
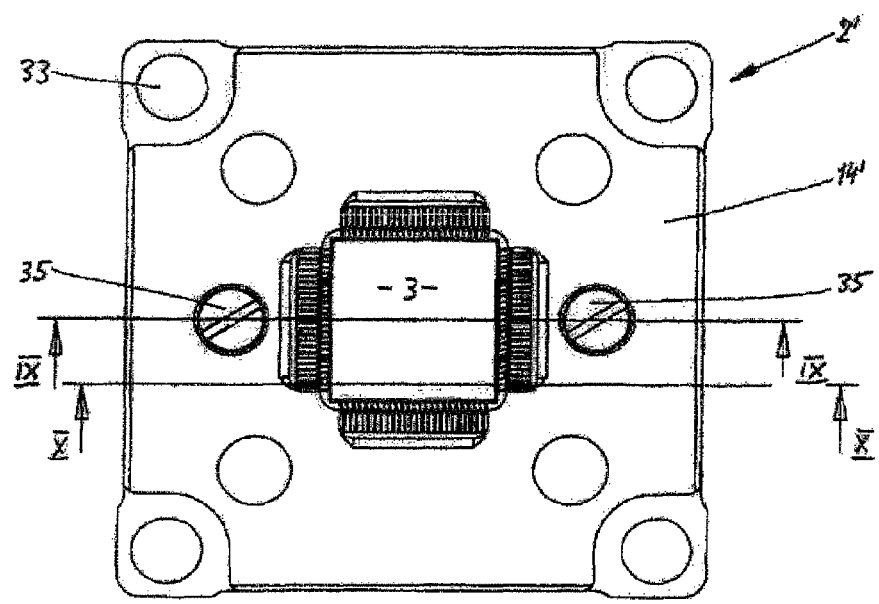
FIG. 8 is a front view of the plunger head from FIG. 5.

In order to tightly suck the component 3 against the retaining base 14, the plunger head 2 comprises a flexible suction head which may be configured similarly to a suction head 23 which can be seen in FIG. 7. This suction head 23 consists of a front corrugated hose 24 and a hose socket 25 connected thereto. In the embodiment shown in FIG. 1, the suction head 23 is connected to a central suction channel 26 which is guided through the base body 6 and connected to a suction line 27 which is in turn guided parallel to and between the guide rods 9 to the rear end piece 10 and is connected there to a vacuum line 10a which leads to a vacuum generation device.

Figure 3:
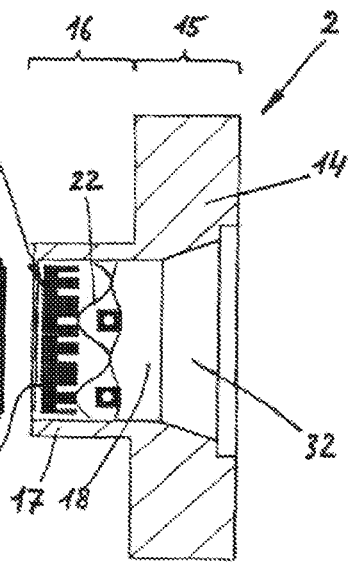
FIG. 3 is a plan view of the heat conducting body from FIG. 2.

Although not shown in FIG. 2, the suction head 23 is arranged centrally inside the passage 18, the corrugated hose 24 extending through a central through-opening 28 in the heat conducting body 19 (FIG. 3). The front end of the corrugated hose 24 projects slightly forwards in an axial direction beyond the front end face 20 of the heat conducting body 19. The body 4 of the sucked-in component 3 can thus be contacted with the suction head 23 and pulled thereby against the heat conducting body 19, by contraction of the corrugated hose 24. Owing to the suction force, the component 3 is subsequently pulled further rearwards together with the heat conducting body 19 which, owing to the spring device 22, is flexibly and resiliently mounted in the axial direction, until the connecting legs 5 of the component 3 rest on the leg supporting webs 17.

In order to bring the component 3 to a specific temperature, which may lie between −60° C. and +200° C. for example, the plunger 1 shown in FIG. 1 also comprises a fluid feed line 29 which is supplied with fluid via a rear-side connection socket 30. A heating or cooling device for the supplied fluid may be found inside the fluid feed line 29. If a heating device is used, it is preferably a heating spiral, by which means the fluid flowing past is heated to the desired temperature. Alternatively however, it is possible that a fluid, in particular clean and temperature-controlled air, which is already at the desired temperature or the temperature of which has already been controlled in a specific manner may have already been fed via the connection socket 30 and introduced into the fluid feed line 29.

The fluid feed line 29 is connected to a fluid feed channel 31 at its front end, which channel penetrates through the base body 6. The fluid feed channel 31 is connected to a fluid distribution chamber 32 (FIG. 2) which is arranged in the plunger head 2. Said fluid distribution chamber 32 consists of a conical space which widens towards the rear, into which space the fluid feed channel 31 of the base body 6 opens. The fluid distribution chamber 32 forms the rear portion of the central passage 18.

If the temperature of the component 3 is to be controlled, a correspondingly temperature-controlled fluid is guided via the fluid feed line 29 to the central passage 18, the heat conducting body 19 being flowed over intensely and its temperature being controlled correspondingly. Some of the fluid also travels through the slits and gaps between the fins 21 of the heat conducting body 19 and directly contacts the component 3. The component 3 is thus quickly and intensely brought to the temperature of the fluid by way of the fluid and heat conduction between the heat conducting body 21 and the body 4 of the component.

A second embodiment of a plunger head 2' will now be described with reference to FIGS. 5 to 10.

The plunger head 2' comprises a retaining base 14' which is configured similarly to the retaining base 14 of the first embodiment, but which can be fixed to a retaining device (not shown) via four fixing holes 33, which are arranged in the corner regions of the cuboidal base portion 15', which retaining device is in turn fixed to guide rods which are similar to the guide rods 9 of FIG. 1 or is formed integrally with the guide rods 9.

A heat conducting body 19' is inserted into the central passage 18 of the retaining base 14', which heat conducting body is substantially cuboidal but may be shaped differently, in particular it may be cylindrical. As can be seen in FIG. 7, the heat conducting element 19' comprises a flat front end face 20 and rear-side fins 21. The suction head 23 already described with reference to the first embodiment penetrates through a central, axial through-opening 28 in the heat conducting body 19'.

The heat conducting body 19' is inserted into the central passage 18 of the retaining base 14' with a small lateral gap.

A retaining element 34 is screwed onto the rear side of the retaining base 14' via screws 35 which penetrate holes 36 in the retaining base 14' and can be screwed into screw holes 37 in the retaining element 34. The retaining element 34 spans the central passage 18 of the retaining base 14'.

On the one hand, the retaining element 34 acts as a connecting element for the suction head 23, and on the other hand it resiliently holds the heat conducting body 19'. The retaining element 34 comprises a front suction line socket 38, to which the hose socket 25 of the suction head 23 can be attached. One or more suction lines 39 (FIG. 7) extend from the suction line socket 38 to a rear suction line socket 40. This suction line socket 40 is connected to a vacuum generation device via a suction line (not shown).

In order to resiliently hold the heat conducting body 19', the retaining element 34 comprises four screw holes 41, into which the rear threaded portions of four elongate bolts 42 can be screwed. The bolts 42 extend parallel to one another and in the axial direction of the plunger 1. The bolts 42 also penetrate through axial though openings 43 which are formed in the corner regions of the heat conducting body 19' and have a substantially greater diameter than the bolts 42. The bolts 42 comprise a bolt head 44 at their front end, which bolt heads are arranged in recesses 45 in the front end region of the heat conducting body 19'. The height of the bolt heads 44 is thus somewhat smaller than the depth of the recesses 45.

Figure 10:
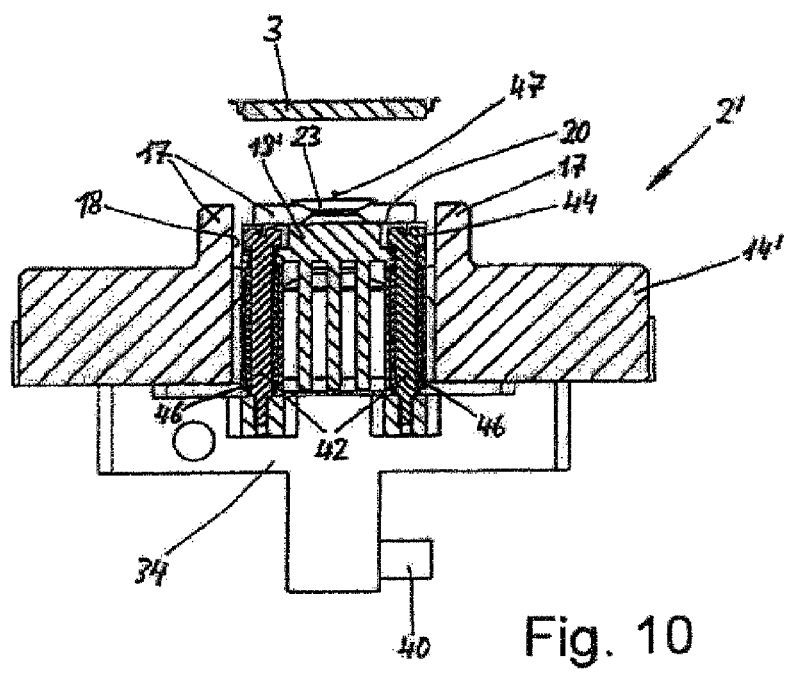
FIG. 10 is a sectional view along line X-X from FIG. 8, the component being shown above.

As can be seen, in particular from FIG. 10, the heat conducting body 19' is pushed forwards by springs 46 in the form of compression springs which are arranged around the bolts 42 and are guided thereby. At their rear ends the springs 46 are supported on the retaining element 34 whilst at their front ends they are supported in a front region of the heat conducting body 19'. The displacement of the heat conducting body 19' in a forwards direction is delimited by the bolt heads 44 which thus act as an axial stop. Provided no component 3 is arranged on the plunger head 2', the front end face of the bolt heads 44 is set back slightly relative to the front end face 20 of the heat conducting body 19', as can be seen in FIG. 10. On the other hand, if a component 3 is indeed arranged on the suction head 23 and sucked-in thereby, the body 4 of the component pushes the heat conducting body 19' back until the body 4 of the component abuts the front end faces of the bolt heads 44. The bolts 22 thus act as axial stops for the component 3, it being possible to adjust the position of these stops by screwing the bolts 42 more tightly into the screw holes 41 or by unscrewing them slightly.

Figure 9:
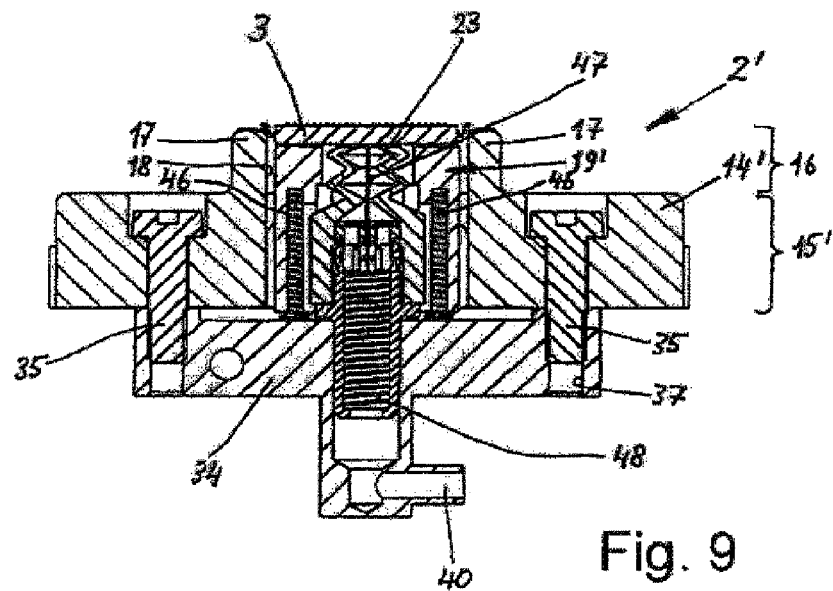
FIG. 9 is a sectional view along line IX-IX from FIG. 8.

As can be seen, in particular from FIG. 9, the plunger head 2' also comprises an axially extending ejector pin 47 which extends centrally through the suction head 23 and is supported at the rear end on an ejector spring 48. If no component 3 is arranged on the plunger head 2', the ejector pin 47 projects slightly forwards, beyond the suction head 23, as can be seen in FIG. 10. If a component 3 is indeed arranged on the suction head, the body 4 of the component pushes the ejector pin 47 back against the bias of the spring 48, as shown in FIG. 9. When the component 3 is to be removed from the plunger head 2' after testing and no more suction force is applied by the suction head 23, the ejector pin 47 supports the removal of the component 3 from the plunger head 2' by way of the bias of the ejector spring 48.

In the embodiment shown in FIGS. 5 to 10, the heat conducting body 19' does not project rearwards beyond the retaining base 14' or only projects therebeyond slightly, the retaining base being covered in part on the rear side by the retaining element 34. In order to still ensure that the heat conducting body 19' can be flowed over effectively by a temperature-controlled fluid, the retaining base 14' comprises fluid guide recesses 49 (FIG. 6) on its rear side which extend laterally outwards from the central passage 18 until they reach the vicinity of two opposite edge regions of the retaining base 14'. Some of the fins 21 are exposed by these fluid guide recesses 49 in such a way that they can be flowed over more effectively by the fluid, which is guided against the rear side of the retaining base 14' and led to the heat conducting body 19' via the fluid guide recesses 49, and their temperature can be correspondingly controlled.

The invention claimed is:

1. A plunger for moving electronic components towards and away from a testing position, the plunger having a plunger head which comprises at least one suction head connected to a vacuum line for applying suction to suck a component into contact with the plunger head, and a heat conducting body comprising a heat conducting material, the heat conducting body having a large surface area in thermal contact with a fluid and being arranged in such a way that the heat conducting surrounds the suction head so that the sucked-in component rests on the heat conducting body when the suction head sucks the component into contact with the plunger head, the heat conducting body being adapted for being temperature-controlled by the fluid, to temperature-control the sucked-in component contact in contact with the heat conducting body.

2. The plunger according to claim 1, wherein the heat conducting body completely circumferentially surrounds the suction head and comprises a central axial through-opening, through which the suction head extends.

3. The plunger according to claim 1, wherein the heat conducting body comprises a plurality of through-openings, through which said suction head is guided.

4. The plunger according to claim 1, wherein the plunger head comprises a retaining base supporting the sucked-in component and has an axial passage, in which the heat conducting body is arranged around the suction head.

5. The plunger according to claim 4, wherein the heat conducting body is arranged resiliently relative to the retaining base.

6. The plunger according to claim 5, wherein the heat conducting body is displaceably guided by bolts extending in an axial direction and at their front end having a bolt head with a front face, which forms an axial stop for the component, and having a rear face which forms an axial stop for the heat conducting body.

7. The plunger according to claim 6, wherein the heat conducting body is pushed forward by springs which are arranged around the bolts.

8. The plunger according to claim 4, wherein the heat conducting body is tiltably arranged relative to the longitudinal axis of the plunger.

9. The plunger according to claim 4, wherein the retaining base comprises fluid guide recesses in its rear side which open into the axial passage in the retaining base so at the rear side of the retaining base conveyed fluid can be guided towards the heat conducting body arranged in the axial passage in a targeted manner.

10. The plunger according to claim 1, wherein the plunger head comprises a retaining base which is configured as a heat conducting body.

11. The plunger according to claim 10, wherein the retaining base has fins on its rear side which enlarge its surface area and thus improve the transfer of heat from the fluid to the retaining base.

12. The plunger of claim 1, wherein the heat conducting body has fins in contact with the fluid which enlarge the surface area to improve the thermal transfer between the fluid and the heat conducting body.

13. A plunger for holding and moving electronic components for testing, the plunger having a plunger head which comprises at least one suction head for sucking in a component and a heat conducting body which can be temperature-controlled by a fluid and is arranged in such a way that the sucked-in component rests on the heat conducting body, wherein the suction head is guided through the heat conducting body, wherein the heat conducting body consists of a disc-shaped body and fins projecting beyond the disc-shaped body, the disc-shaped body comprising a flat front end face which can be contacted with the component, and the fins projecting rearwards beyond the disc-shaped body.

14. A plunger for moving electronic components towards and away from a testing position, the plunger comprising:
- a suction head connected to a vacuum line and configured to apply suction to hold an electronic component; and
- a heat conducting body surrounding the suction head, the heat conducting body comprising a heat conductive material, said heat conducting body being arranged with respect to the suction head so that the electronic component rests on the heat conducting body while the suction head uses suction to hold the electronic component, the heat conducting body thereby controlling the temperature of the electronic component; and
- a fluid feed line associated with the heat conducting body, the fluid feed line providing a fluid contacting the heat conducting body to control the temperature of the heat conducting body and the electronic component resting thereon.

15. The plunger according to claim 14, wherein the heat conducting body completely circumferentially surrounds the suction head and comprises a central axial through-opening, through which the suction head extends.

16. The plunger of claim 14, wherein the heat conducting body is structured so that an opposing surface of the electronic component can completely contact the heat conducting body when the suction head sucks in and retains the component.

17. The plunger of claim 14, wherein the heat conducting body has fins in contact with the fluid, the fins providing an enlarged surface area in contact with the fluid to improve thermal transfer between the fluid and the heat conducting body.

* * * * *